United States Patent [19]

Locke

[11] Patent Number: 4,682,001

[45] Date of Patent: Jul. 21, 1987

[54] MULTI-LEAD LASER SOLDERING APPARATUS

[75] Inventor: Edward V. Locke, Rockport, Mass.

[73] Assignee: Laser Corporation of America, Lowell, Mass.

[21] Appl. No.: 822,027

[22] Filed: Jan. 24, 1986

[51] Int. Cl.$^4$ .............................................. B23K 26/00
[52] U.S. Cl. ...................... 219/121 LC; 219/121 LU; 219/121 LV; 219/121 LT; 372/108
[58] Field of Search ................ 219/121 LU, 121 LV, 219/121 LT, 121 LC, 121 LD, 121 L, 121 LM, 121 LG, 121 LN; 372/108, 64, 61; 350/10, 29, 30

[56] References Cited

U.S. PATENT DOCUMENTS

| | | |
|---|---|---|
| 3,315,680 | 4/1967 | Silbertrust et al. ....... 219/121 LV X |
| 3,408,937 | 11/1968 | Lewis et al. ..................... 372/108 X |
| 3,467,098 | 9/1969 | Ayres ............................... 219/121 X |
| 3,577,094 | 5/1971 | Tomlinson et al. .................. 372/108 |
| 4,390,994 | 6/1983 | Roberts et al. ................. 372/108 X |

FOREIGN PATENT DOCUMENTS

| | | |
|---|---|---|
| 2647618 | 4/1978 | Fed. Rep. of Germany ... 219/121 L |
| 0064487 | 4/1982 | Japan ............................. 219/121 LU |

Primary Examiner—C. L. Albritton

[57] ABSTRACT

Apparatus for simultaneously soldering all the leads of a multi-lead SMP device to the pads of a substrate utilizes a gas laser having a cylindrical resonant cavity terminated at one end by a mirror that reflects energy back into the laser cavity. A plurality of beamlets corresponding to the number of leads of the SMP device are coupled out of the laser through holes in the mirror. All the beamlets have substantially the same amount of radiant energy. Each beamlet enters the near end of a different one of a corresponding number of elongate flexible optical wave guides extending away from the mirror toward an imaging lens. The far end of each optical wave guide is arranged so that its position can be moved. That enables the far ends of the wave guides to be arranged in different patterns to match the various patterns of leads of different SMP devices. The beamlets emerging from the far ends of the optical wave guides are focussed by the imaging lens on the joints to be soldered. The radiant energy of those beamlets is turned into heat and causes the solder at the joints to reflow so that all the soldered connections are made at the same time.

4 Claims, 7 Drawing Figures

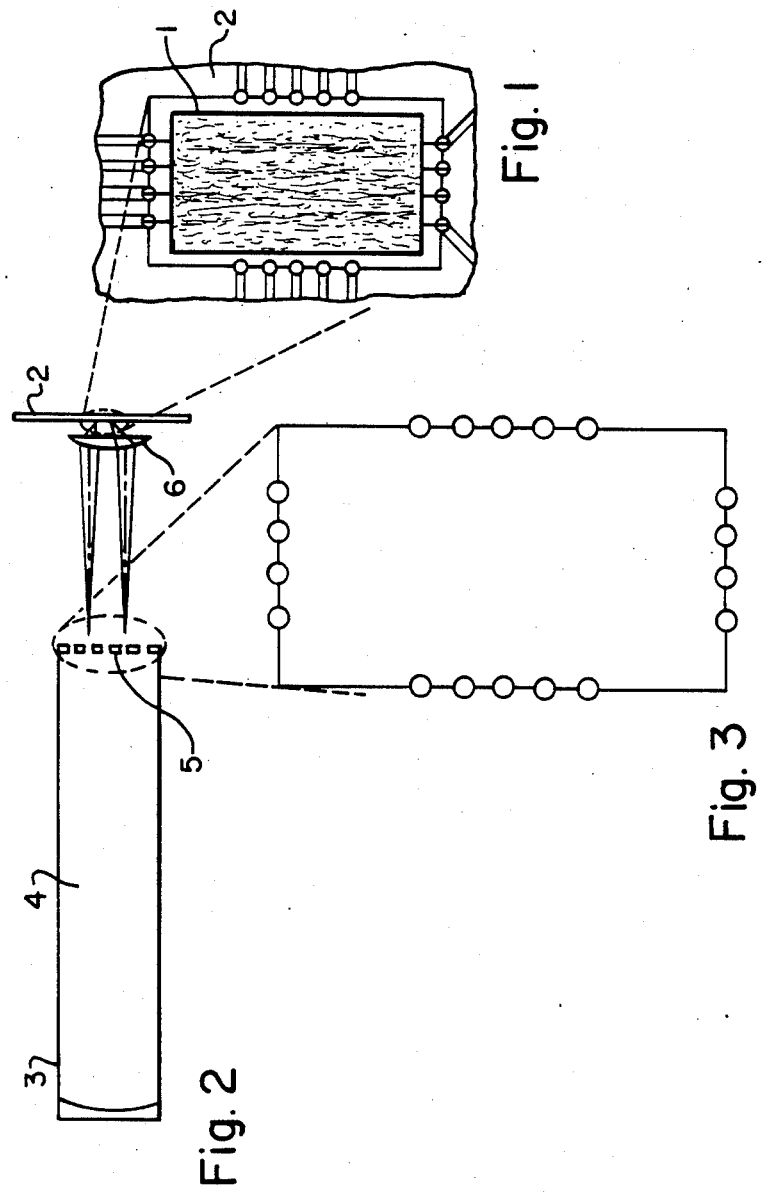

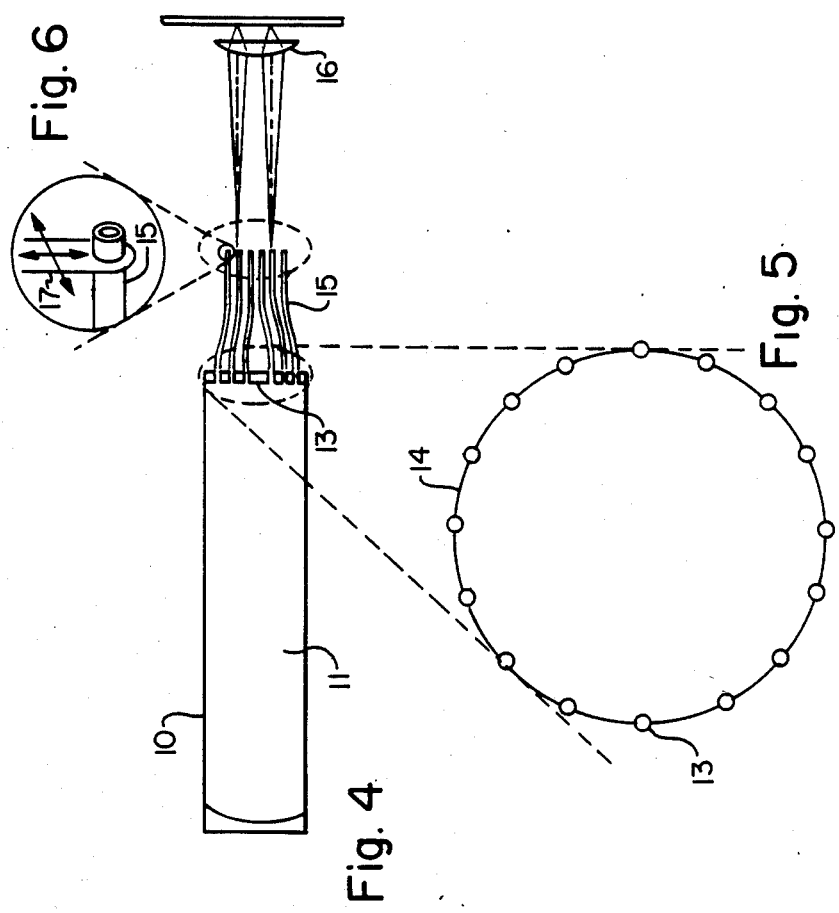

MULTI-LEAD LASER SOLDERING APPARATUS

FIELD OF THE INVENTION

This invention relates in general to high density packaging of electronic components on a substrate having electric conductors to which the leads of the electronic components are attached. More particularly, the invention pertains to the securing of the leads of surface mounted electronic components to the electric conductors of the substrate.

BACKGROUND OF THE INVENTION

One conventional way of high density packaging of electronic components utilizes a printed circuit board having holes in it which allow the leads of the electronic components to protrude through the board. The components are situated on one side of the board with their leads extending through the holes in the board to the opposite side. The leads are usually soldered to the printed wiring by the wave soldering process in which the crest of a wave of molten solder progresses along the bottom of the board and wets with molten solder the leads and the printed wire terminals that are to be connected. The solder, upon solidifying, provides a good electrical path lead and the terminal. Because only one side of the printed circuit board is used for virtually all of the soldered connections and because wave soldering is so prevalent, it is accepted practice to mount all the electronic components on the other side of the board. To facilitate that manner of packaging electronic components, most electric components having many leads, such as integrated circuit devices, are produced as DIP's—that is, are produced with two parallel rows of leads which are long enough to enable the leads to extend through the holes of the circuit board. The term DIP is an acronym for dual inline package.

The number of electronic components that can be mounted on a printed circuit board or on a substrate having electrically conductive pads to which the leads are to be attached, can be increased by mounting electronic components on both sides of the board or substrate. However, by placing electronic components on both sides of the substrate or board, the wave soldering process is interfered with to such an extent that in most instances it cannot be successfully used to make the requisite connections.

There is currently an increasing tendency to package multi-lead electronic components by the method of surface mounting. In that method, electronic devices known as SMP's are used rather than DIP's. The term SMP is an acronym for surface mounted package. The SMP device has protruding leads for attachment to pads on the substrate or board which are located on the same side as the side on which SMP device is mounted. Because the leads of the SMP device do not extend through holes in the substrate or board, those leads need be only long enough to reach the pads. Consequently, the leads of SMP device are usually short stubby wires that protrude from the SMP device. The surface mounting technique allows components to be mounted on both sides of the board or substrate. For ease of exposition, the terms "board" and "substrate" are hereinafter used interchangably to mean any kind of support on which electronic components can be mounted and which has electrically conductive paths providing terminals or pads to which the leads of the mounted components can be secured to provide electrical connections.

In one widely used method of surface mounting, the SMP devices are attached by an adhesive (such as an epoxy glue) to the board. When all (or almost all) the components have been attached to the board, the entire "populated" board is placed in an oven whose temperature is high enough to cause pre-positioned solder to reflow locally around each joint. That method, while it enables all the soldered connections to be made in a single heating step, has a number of significant drawbacks, among which are:

(a) most of the energy in heating the entire board to the solder reflow temperature is wasted because the only locations that need be heated are in the vicinity of the joints to be soldered;

(b) in the cool-down phase, stresses are introduced in the solder joints because of the difference in the coefficients of thermal expansion between the board and the SMP devices; and (c) the exposure of the SMP devices to the high temperature in the oven may damage the integrated circuits within those devices or reduce the life or reliability of those devices.

The last cited of those drawbacks is the most significant one because electronic devices in which the semiconductor is silicon or germanium or other heat sensitive material have critical heat limitations which must not be exceeded to preserve the reliability of the device and to avoid catastrophic failure.

To avoid the disadvantages of the surface mounting procedure in which the soldered connections are made by heating the populated board in an oven, it has been proposed to solder each joint, one or two at a time, by using a laser beam to heat the joint. That method of using a laser beam for "sequential" soldering is described in U.S. Pat. No. 4,327,277, granted on Apr. 27, 1982 to Kevin Daly.

The "sequential" soldering method is slow because a solder joint requires about 0.1 to 0.2 seconds to complete. Although the time can be shortened somewhat by using high power beams from the laser source, that time cannot be significantly shortened because the radiant energy deposited by the beam on the surface is turned into heat and that heat must have sufficient time to be conducted through the pre-positioned solder at the joint to insure the making of a reliable soldered connection. A typical SMP device has 24 to 48 leads so that the total time to make soldered connections by the "sequential" method is much too slow for high production in surface mounted packaging.

To avoid the tedious, time consuming method of bonding multiple leads one at a time, U.S. Pat. No. 3,632,955 to Cruickshank et al proposes to shape a beam of radiant energy into a pattern suitable for simultaneously bonding all the leads in one operation. To accomplish that purpose, a composite cylindrical lens is employed having a plurality of lens segments. A beam of radiant energy is directed onto the lens and is focussed into two pairs of parallel lines which form a rectangle that is congruent with the geometric arrangement of the leads to be bonded. The rectangle of radiant energy is directed onto the leads without having any of that energy incident upon the device from which the leads extend.

The Cruickshank et al bonding method is inflexible in that each different geometrical configuration requires its own composite cylindrical lens and because there is no provision for adjustment of the radiation pattern for individual leads. Further, in the Cruickshank et al bonding method, much of the radiant energy is wasted either by falling on areas between the leads or by absorption or reflection from a mask that intercepts that energy before it can reach the areas between the leads.

OBJECTIVES OF THE INVENTION

The principal objective of the invention is to provide apparatus for enabling all the leads of a multiple lead SMP device to be simultaneously bonded to pads on a substrate while avoiding the disadvantages of prior bonding procedures.

Another objective of the invention is to promote high production in surface mounted packaging by directing beamlets of radiant energy upon the joints to be connected to quickly produce the heat necessary for the making of reliable electrical connections.

A further objective of the invention is to provide multiple lead bonding apparatus utilizing a plurality of beamlets whose individual positions can be adjusted to permit a variety of beamlet patterns to be obtained that match the different lead configurations of SMP devices whereby all the leads of a device can be simultaneously bonded to a substrate.

THE DRAWINGS

FIG. 1 depicts a multiple lead SMP device of the kind with which the invention is concerned.

FIG. 2 schematically depicts a rudimentary arrangement of apparatus for simultaneously soldering all the leads of an SMP device to a substrate in one operation.

FIG. 3 shows the arrangement of holes in the laser's mirror through which beamlets are outputted in a pattern that corresponds to the pattern of the leads of the SMP device.

FIG. 4 schematically shows the arrangement of the preferred embodiment of the invention.

FIG. 5 shows the arrangement of beamlet output holes in the laser's mirror employed in the preferred embodiment.

FIG. 6 schematically depicts the adjustments for moving the far end of a flexible optical wave guide.

FIG. 7 is a graph showing the transmission efficiency of beam propagation through an unpolished copper tube optical wave guide.

DESCRIPTION OF RUDIMENTARY ARRANGEMENT

To appreciate some of the problems involved in simultaneously bonding all the leads of a multiple lead SMP device to a substrate, consider the rectangular SMP device 1 shown in FIG. 1 which has eighteen leads that are to be simultaneously soldered to pads on a substrate 2. Each pad has on it a solder preform or solder paste which is to be reflowed to form a soldered joint between the pad and the lead. The objective is to form the soldered joints quickly and all at one time to avoid significantly heating the package. To accomplish that purpose, each lead and its pad is to be heated by radiant energy to cause reflow of the solder. To form all the soldered joints at one time, the same amount of radiant energy is to be directed onto each joint during the irradiation interval. It is consequently, necessary to provide eighteen beamlets all of which have substantially the same heating effect upon the joints to be soldered.

FIG. 2 depicts a rudimentary arrangement in which the eighteen beamlets are obtained from a gas laser 3 having a resonant cavity 4 of a conventional type. The eighteen beamlets are emitted through holes in an output mirror 5 disposed at one end of the resonant cavity. The mirror 5 reflects back into the resonant cavity substantially all the radiant energy that is not outputted through the holes. To obtain eighteen beamlets of uniform cross-section, all the holes, as shown in FIG. 3, are of the same diameter. The pattern of holes shown in FIG. 3 is larger than but of the same configuration as the joints to be soldered. A major problem of that arrangement is that the beamlets will be of different energies in dependence on the location of its hole in the output mirror. It is well known that the energy profile of a gas laser is not uniform across the resonant cavity and, consequently, the amount of radiant energy emitted from a hole in the output mirror depends upon the size of the hole and the position of the hole. To further complicate the matter, there is a tendency in lasers employing a stable resonant cavity to develop hot spots, i.e., spots of intense radiant energy.

The radiant energy emitted through the holes in the output mirror is substantially collimated and thus provides eighteen substantially parallel beamlets. Those beamlets are incident upon an imaging lens 6 that reduces the pattern of beamlets to essentially the same size as the pattern of leads so that each beamlet has its radiant energy fall upon a different one of the joints to be soldered. Inasmuch as the imaging lens produces a greatly miniaturized image of the hole pattern, all the beamlets tend to converge as they reach the image plane at the surface of the substrate and thus impinge upon the joints to be soldered at an acute angle to the substrate. That angular incidence of the beamlets is particularly well suited to the geometries of the leads of most SMP devices. Where all the beamlets have the same amount of radiant energy, the joints will be uniformly heated and all the soldered connections will be made at the same time.

The FIG. 2 arrangement is inflexible in that each SMP device having a different configuration of leads requires the output mirror to have a matching configuration of holes and further, the FIG. 2 arrangement does not allow adjustment for individual leads.

DETAILED DESCRIPTION OF THE PREFERRED EMBODIMENT

Figure 7:
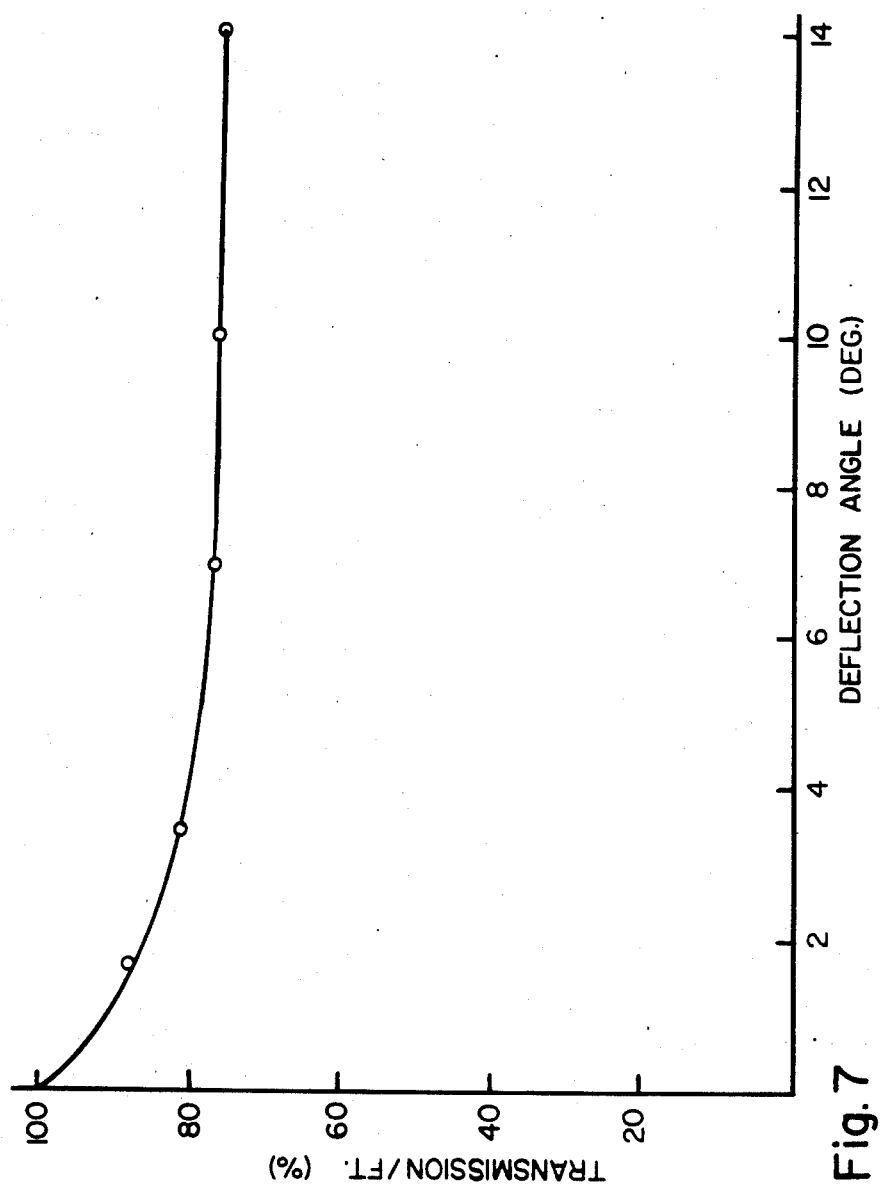

Shown in FIGS. 4, 5 and 6 is the preferred embodiment of the invention. That embodiment has adjustment provisions enabling each beamlet to be adjusted relative to the joint to be heated by the beamlet's radiant energy. In the preferred embodiment, a gas laser 10 is employed having a cylindrical laser cavity 11 terminated at one end by a circular mirror 12. Assuming the SMP device has eighteen leads arranged as depicted in FIG. 1, the mirror 12 is provided with the corresponding number of holes to enable eighteen beamlets to be obtained from the laser. To ensure that all the beamlets have substantially the same amount of radiant energy, the holes 13 are uniform in size and are symmetrically disposed, as shown in FIG. 5, on a circle 14 that is concentric with the longitudinal axis of the laser cavity. Extending from each hole is a copper tube 15 that acts as a light pipe, i.e., as an optical wave guide. The interior of the copper tube preferably is polished to provide a highly reflective surface, although acceptable results can be obtained with unpolished copper tubing if the tubing is not bent too far out of line. The tubing is gradually bent, as indicated in FIG. 4, so that the far ends of all the tubes are approximately in the same object plane with respect to the imaging lens 16. When viewed end-on, the output ends of the light pipes present a pattern that is of larger size but of the same configuration as the leads of the SMP device. To provide adjustment of a beamlet in relation to the individual lead that is to be soldered, each light pipe at its far end is provided, as shown in FIG. 6 with a collar which can be adjusted to change the position of that end of the tube. To facilitate movement of the tube's end, the tube is preferably made of soft copper. Preferably, the collar, as indicated in FIG. 6, is adjustable so that the tube's end can be moved in two orthogonal planes. The devices for providing those adjustments can be conventional mechanisms.

Shown in FIG. 7 is a graph of beam propagation through an unpolished copper tube optical wave guide having a $\frac{1}{4}''$ outside diameter. Plotted along the abscissa in degrees is the angular deflection of the beam in traversing the tube. Plotted along the ordinate is the transmission efficiency in percent per foot of tubing. The transmission efficiency would, of course, be higher for a polished copper tube. Even with unpolished copper tubing the loss of power for significant bending of the tube, $\pm \frac{1}{2}''$ for a tube 12" in length is not appreciable and consequently the ends of the tubes can be moved with small X-Y mechanical positioning mechanism to obtain virtually any pattern of beamlets in the image plane. Enough flexibility is provided by the copper tubing light pipes to enable the generation of a variety of patterns suitable to the different lead configurations of SMP devices.

A typical SMP device has from 24 to 48 leads. To accomplish quick soldering with acceptable quality, it is estimated that the laser beamlet must have a power of about 15 to 20 Watts. By rough calculation, a total laser output power between 360 to 960 Watts is needed to produce all the beamlets of the power required to simultaneously solder all the joints within an interval of less than one half of a second. By keeping the heating interval short, significant heating of the SMP device is avoided. Reliable soldering can be obtained with a heating interval of as little as one tenth of a second where beamlets of sufficient power are used.

I claim:

1. Apparatus for simultaneously joining the leads of a multi-lead device to pads on a substrate, the apparatus comprising,
   (a) a laser having a resonant cavity,
   (b) a mirror disposed at one end of the resonant cavity, the mirror having a plurality of holes for outputting a plurality of beamlets of substantially collimated radiant energy, there being a beamlet for each lead to be simultaneously bonded of the multi-lead device,
   (c) a corresponding plurality of elongate flexible optical wave guides, each beamlet entering the near end of a different one of the optical wave guides,
   (d) adjustable means attached to each of the flexible optical wave guides for enabling the far end of each of those wave guides to be moved in two orthogonal planes whereby the far end of each of the optical wave guides may be independently positioned in different patterns which match the arrangement of the leads of different multi-lead devices,
   (e) means for focussing the beamlets emerging from the far ends of the wave guides upon the joints to be bonded such that the beamlets impinge upon the joints to be bonded at an acute angle to the substrate.

2. The invention according to claim 1, wherein the elongate flexible optical wave guides are copper tubes.

3. The invention according to claim 1, wherein the plurality of holes in the mirror are all of the same size and are symmetrically disposed about a circle.

4. The invention according to claim 3, wherein the resonant cavity of the laser is cylindrical and the circle is concentric with the longitudinal axis of the resonant cavity.

* * * * *